(12) United States Patent
Kang et al.

(10) Patent No.: US 11,164,912 B2
(45) Date of Patent: Nov. 2, 2021

(54) DISPLAY APPARATUS HAVING COLOR FILTERS AND A LIGHT-SHIELDING ELEMENT

(71) Applicant: LG Display Co., Ltd., Seoul (KR)

(72) Inventors: Ha-Na Kang, Seoul (KR); Go-Eun Kim, Incheon (KR); Ji-Min Park, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 61 days.

(21) Appl. No.: 16/698,220

(22) Filed: Nov. 27, 2019

(65) Prior Publication Data
US 2020/0176517 A1 Jun. 4, 2020

(30) Foreign Application Priority Data
Nov. 29, 2018 (KR) .................. 10-2018-0151015

(51) Int. Cl.
*H01L 27/32* (2006.01)
*H01L 51/52* (2006.01)
*G02B 5/20* (2006.01)

(52) U.S. Cl.
CPC ........ *H01L 27/322* (2013.01); *H01L 51/5253* (2013.01); *H01L 51/5259* (2013.01); *H01L 51/5284* (2013.01); *G02B 5/201* (2013.01); *H01L 27/3258* (2013.01)

(58) Field of Classification Search
CPC ............... H01L 27/322; H01L 27/3258; H01L 27/3244; H01L 51/5284; H01L 51/5253; H01L 51/5259; H01L 51/5209; H01L 2251/5369; G02B 5/201; G02B 5/223
See application file for complete search history.

(56) References Cited

U.S. PATENT DOCUMENTS

| 2015/0179586 A1* | 6/2015 | Youk ................. G02F 1/133512 428/195.1 |
| 2018/0197921 A1* | 7/2018 | Kim ...................... G06F 3/0412 |
| 2018/0277610 A1* | 9/2018 | Kubota ............... H01L 51/5237 |

FOREIGN PATENT DOCUMENTS

| JP | 2007-27042 A | 2/2007 |
| JP | 2008-288057 A | 11/2008 |
| JP | 2009-122435 A | 6/2009 |
| JP | 2010-139975 A | 6/2010 |
| JP | 2017-143022 A | 8/2017 |
| JP | 2018-163734 A | 10/2018 |

* cited by examiner

*Primary Examiner* — Kyoung Lee
*Assistant Examiner* — Christina A Sylvia
(74) *Attorney, Agent, or Firm* — Birch, Stewart, Kolasch & Birch, LLP

(57) ABSTRACT

A display apparatus having color filters and a light-shielding element is provided. The color filters and the light-blocking element are disposed on a surface of a device substrate. The color filters on a display area of the device substrate can include a dye. The light-blocking element on a bezel area of the device substrate can have a stacked structure of a first blocking filter layer and a second blocking filter layer. The first blocking filter layer and the second blocking filter layer can include the different dye. In the display apparatus, process efficiency can be improved, and the overall thickness can be reduced.

15 Claims, 4 Drawing Sheets

DISPLAY APPARATUS HAVING COLOR FILTERS AND A LIGHT-SHIELDING ELEMENT

CROSS-REFERENCE TO RELATED APPLICATION

This application claims the priority benefit of Korean Patent Application No. 10-2018-0151015, filed on Nov. 29, 2018 in the Republic of Korea, which is hereby incorporated by reference as if fully set forth herein.

BACKGROUND OF THE INVENTION

Field

The present invention relates to a display apparatus including color filters on a display area of a device substrate, and a light-blocking element on a bezel area of the device substrate.

Discussion of the Background Art

Generally, an electronic appliance, such as a monitor, a TV, a laptop computer and a digital camera, includes a display apparatus to realize an image. For example, the display apparatus can include light-emitting devices. Each of the light-emitting devices can emit light displaying a specific color. For example, each of the light-emitting devices can include a light-emitting layer between a lower electrode and an upper electrode.

The display apparatus can include a display area and a bezel area. The light-emitting devices can be disposed in the display area. The bezel area can be disposed outside the display area. A circuit portion and lines, which provide various signals for driving and controlling the light-emitting devices, can be disposed on the bezel area.

However, in the display apparatus, the external light can be reflected by a metal electrode and the lines in the bezel area. Thus, in the display apparatus, the quality of the image realized in the display area can be deteriorated by the external light reflected in the bezel area. Further, although a light-blocking element can be added to prevent reflection of the external light, process efficiency of the display apparatus can be decreased by a process of forming the light-blocking element.

SUMMARY OF THE INVENTION

Accordingly, the present invention is directed to a display apparatus that substantially obviates one or more problems due to limitations and disadvantages of the related art.

An object of the present invention is to provide a display apparatus capable of preventing the reflection of the external light in the bezel area without decreasing the process efficiency.

Additional advantages, objects, and features of the invention will be set forth in part in the description, which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus including a device substrate. The device substrate includes a display area and a bezel area. The bezel area is disposed outside the display area. Color filters are disposed on the display area of the device substrate. Each of the color filters is made of dye. Light-emitting devices are disposed on the color filters. Each of the light-emitting devices includes a lower electrode being in contact with the corresponding color filter. A light-blocking element is disposed on the bezel area of the device substrate. The light-blocking element has a stacked structure of blocking filter layers including different dyes.

The light-blocking element can have a stacked structure of a first blocking filter layer including a red dye and a second blocking filter layer including a blue dye.

The light-blocking element can further include a third blocking filter layer having a green dye.

Blocking moisture-absorbing particles can be dispersed in the blocking filter layers.

An encapsulating layer can be disposed on the light-emitting devices. The encapsulating layer can extend onto the bezel area of the device substrate. An encapsulation substrate can be disposed on the encapsulating layer. A side surface of the encapsulating layer can be disposed between a side surface of the device substrate and the light-blocking element.

A blocking passivation layer can be disposed between the light-blocking element and the encapsulating layer. A water vapor transmission rate of the blocking passivation layer can be lower than a water vapor transmission rate of the light-blocking element.

In another embodiment, the display apparatus include a first color filter. The first color filter is disposed on a first pixel region of a device substrate. The first color filter includes a first dye. A first light-emitting device is disposed on the first color filter. The first light-emitting device includes a first lower electrode. The first lower electrode is in contact with the first color filter. A second color filter is disposed on a second pixel region of the device substrate. The second color filter includes a second dye. The second dye is different from the first dye. A second light-emitting device is disposed on the second color filter. The second light-emitting device includes a second lower electrode. The second lower electrode is in contact with the second color filter. A light-blocking element is disposed on a bezel area of the device substrate. The light-blocking element has a stacked structure of a first blocking filter layer including the first dye and a second blocking filter layer including the second dye. The bezel area is disposed outside a display area including the first pixel region and the second pixel region.

A thickness of the first blocking filter layer can be the same as a thickness of the first color filter. A thickness of the second blocking filter layer can be the same as a thickness of the second color filter.

An encapsulating layer can cover the first light-emitting device and the second light-emitting device. The encapsulating layer can extend onto the bezel area of the device substrate. An encapsulation substrate can be disposed on the encapsulating layer. A first side of the light-blocking element toward a side surface of the device substrate can be disposed outside the encapsulating layer.

The encapsulating layer can include an encapsulation moisture-absorbing material.

A blocking passivation layer can be disposed on the first side of the light-blocking element. The blocking passivation layer can extend between the light-blocking element and the encapsulating layer.

The blocking passivation layer can have a hardness larger than that of the light-blocking element.

A second side of the light-blocking element opposite the first side can be disposed on the bezel area of the device substrate.

The second side of the light-blocking element can be disposed outside the blocking passivation layer. The encapsulating layer can be in contact with the second side of the light-blocking element.

The second color filter can be spaced away from the first color filter. A space between the first color filter and the second color filter can be filled by a bank insulating layer. The bank insulating layer can cover an edge of the first lower electrode and an edge of the second lower electrode.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
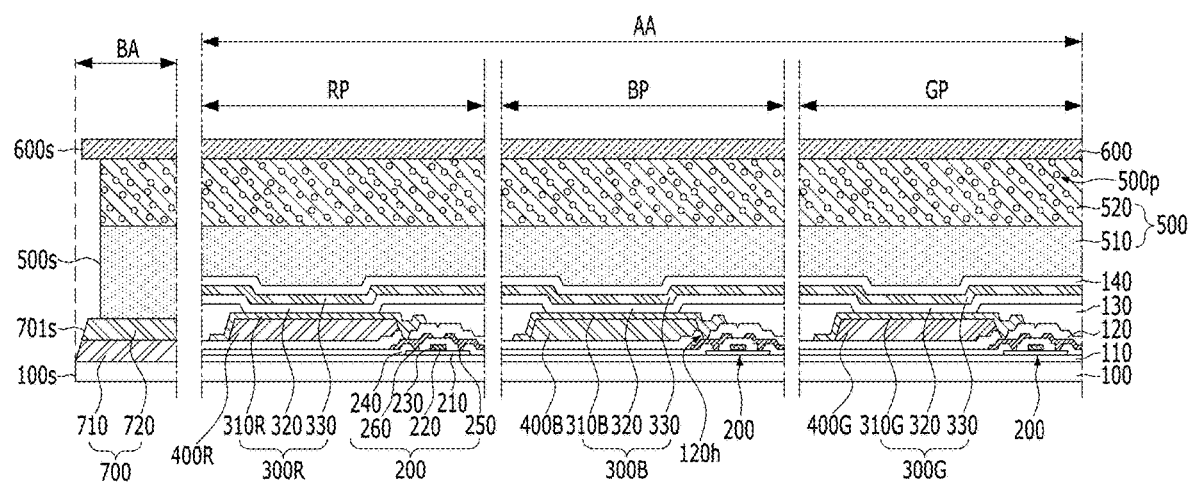
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2:
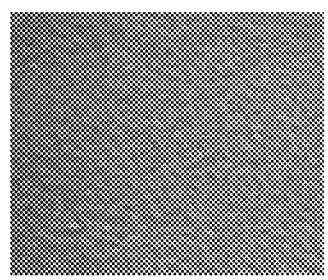
FIG. 2 is a view showing a surface of a color filter in the display apparatus according to the embodiment of the present invention.

FIG. 1 is a view schematically showing a display apparatus according to an embodiment of the present invention. FIG. 2 is a view showing a surface of a color filter in the display apparatus according to the embodiment of the present invention. All the components of the display apparatus according to all embodiments of the present invention are operatively coupled and configured.

Referring to FIGS. 1 and 2, the display apparatus according to the embodiment of the present invention can include a device substrate 100. The device substrate 100 can include an insulating material. The device substrate 100 can include a transparent material. For example, the device substrate 100 can include glass or plastic.

The device substrate 100 can include a display area AA and a bezel area BA. The display area AA can generate an image provided to a user. The display area AA can include pixel regions RP, BP and GP. Each of the pixel regions RP, BP and GP can realize a color different from adjacent pixel regions RP, BP and GP. For example, the pixel regions RP, BP and GP can include a red pixel region RP realizing red color, a blue pixel region BP realizing blue color, and a green pixel region GP realizing green color. As variations, the display area AA can include different combinations of red, green and blue pixel regions alone or with a white pixel region.

A component element to emit light displaying the corresponding color can be disposed in each pixel region RP, BP and GP. For example, light-emitting device 300R, 300B and 300G, and color filter 400R, 400B and 400G can be stacked on each pixel region RP, BP and GP of the device substrate 100.

Each of the light-emitting devices 300R, 300B and 300G can include a lower electrode 310R, 310B and 310G, a light-emitting layer 320 and an upper electrode 330.

The lower electrodes 310R, 310B and 310G can include a conductive material. The lower electrodes 310R, 310B and 310G can include a transparent material. For example, the lower electrodes 310R, 310B and 310G can be a transparent electrode formed of a transparent conductive material, such as ITO and IZO.

The light-emitting layer 320 can generate light having luminance corresponding to a voltage difference between the lower electrode and the upper electrode 330. For example, the light-emitting layer 320 can include an emission material layer (EML) having an emission material. The emission material can be an organic material. For example, the display apparatus according to the embodiment of the present invention can be an organic light-emitting display apparatus having an organic emission material.

The light-emitting layer 320 can have a multi-layer structure in order to increase luminous efficacy. For example, the light-emitting layer 320 can further include at least one of a hole injection layer (HIL), a hole transporting layer (HTL), an electron transporting layer (ETL) and an electron injection layer (EIL).

The upper electrode 330 can include a conductive material. The upper electrode 330 can include a material different from the lower electrode 310R, 310B and 310G. For example, the upper electrode 330 can include a metal having a high reflectance such as aluminum (Al). Thus, in the display apparatus according to the embodiment of the present invention, the light generated by the light-emitting layer 320 of each light-emitting device 300R, 300B and 300G can be emitted to outside through the device substrate 100.

A driving circuit for controlling the corresponding light-emitting device 300R, 300B and 300G can be disposed in each pixel region RP, BP and GP of the device substrate 100. The driving circuit can supply a driving current corresponding to a data signal applied through a data line to the corresponding light-emitting device 300R, 300B and 300G according to a gate signal applied through a gate line. The driving circuit can include at least one thin film transistor 200 and a storage capacitor. For example, the lower electrode 310R, 310B and 310G of each light-emitting device 300R, 300B and 300G can be electrically connected to the thin film transistor 200 of the corresponding driving circuit.

The thin film transistor 200 of the driving circuit in each pixel region RP, BP and GP can include a semiconductor pattern 210, a gate insulating layer 220, a gate electrode 230, an interlayer insulating layer 240, a source electrode 250 and a drain electrode 260.

The semiconductor pattern 210 can be disposed close to the device substrate 100. The semiconductor pattern 210 can include a semiconductor material. For example, the semiconductor pattern 210 can include amorphous silicon or poly-silicon. The semiconductor pattern 210 can be an oxide semiconductor. For example, the semiconductor pattern 210 can include IGZO.

The semiconductor pattern 210 can include a source region, a drain region and a channel region. The channel region can be disposed between the source region and the drain region. The channel region can have an electrical conductivity lower than the source region and the drain region. For example, the source region and the drain region can have a concentration of the conductive impurity higher than the channel region.

The gate insulating layer 220 can be disposed on a portion of the semiconductor pattern 210. For example, the channel region of the semiconductor pattern 210 can be disposed between the device substrate 100 and the gate insulating layer 220. The source region and the drain region of the semiconductor pattern 210 can be exposed by the gate insulating layer 220.

The gate insulating layer 220 can include an insulating material. For example, the gate insulating layer 220 can include silicon oxide (SiO) and/or silicon nitride (SiN). The gate insulating layer 220 can have a multi-layer structure. The gate insulating layer 220 can include a high-K material. For example, the gate insulating layer 220 can include hafnium oxide (HfO) or titanium oxide (TiO).

The gate electrode 230 can be disposed on the gate insulating layer 220. The gate electrode 230 can be insulated from the semiconductor pattern 210 by the gate insulating layer 220. For example, the gate electrode 230 can overlap the channel region of the semiconductor pattern 210.

The gate electrode 230 can include a conductive material. For example, the gate electrode 230 can include a metal, such as aluminum (Al), chrome (Cr), molybdenum (Mo) and tungsten (W).

The interlayer insulating layer 240 can be disposed on the semiconductor pattern 210 and the gate electrode 230. The interlayer insulating layer 240 can be extended beyond the semiconductor pattern 210. For example, a side surface of the semiconductor pattern 210 and a side surface of the gate electrode 230 can be covered by the interlayer insulating layer 240.

The interlayer insulating layer 240 can include an insulating material. For example, the interlayer insulating layer 240 can include silicon oxide (SiO).

The source electrode 250 and the drain electrode 260 can be disposed on the interlayer insulating layer 240. The source electrode 250 can be electrically connected to the source region of the semiconductor pattern 210. The drain electrode 260 can be electrically connected to the drain region of the semiconductor pattern 210. The drain electrode 260 can be spaced away from the source electrode 250. For example, the interlayer insulating layer 240 can include a contact hole exposing the source region of the semiconductor pattern 210, and a contact hole exposing the drain region of the semiconductor pattern 210.

The source electrode 250 and the drain electrode 260 can include a conductive material. For example, the source electrode 250 and the drain electrode 260 can include a metal, such as aluminum (Al), chrome (Cr), molybdenum (Mo) and tungsten (W). The drain electrode 260 can include a material that is the same as a material of the source electrode 250. The gate electrode 230 can include a material different from that of the source electrode 250 and the drain electrode 260.

A buffer layer 110 can be disposed between the device substrate 100 and the driving circuit of each pixel region RP, BP and GP. For example, the buffer layer 110 can extend between the device substrate 100 and the thin film transistor 200 of each pixel region RP, BP and GP.

The buffer layer 110 can include an insulating material. For example, the buffer layer 110 can include silicon oxide (SiO) and/or silicon nitride (SiN). The buffer layer 110 can have a multi-layer structure.

A lower passivation layer 120 can be disposed on the driving circuit of each pixel region RP, BP and GP. The lower passivation layer 120 can prevent the damage of each driving circuit due to external impact and moisture. The driving circuit of each pixel region RP, BP and GP can be completely covered by the lower passivation layer 120. For example, the lower passivation layer 120 can extend along an upper surface of each thin film transistor 200 opposite to the device substrate 100. Each of the light-emitting devices 300R, 300B and 300G can be electrically connected to the drain electrode 260 of the corresponding thin film transistor 200. For example, the lower passivation layer 120 can include contact holes 120h exposing the drain electrode 260 of the thin film transistor 200 of each pixel region RP, BP and GP.

The lower passivation layer 120 can include an insulating material. The lower passivation layer 120 can include an inorganic material. The lower passivation layer 120 can include a material different from the interlayer insulating layer 240. For example, the lower passivation layer 120 can include silicon nitride (SiN).

The light-emitting devices 300R, 300B and 300G can be driven, independently. For example, the lower electrode 310R, 310B and 310G of each light-emitting device 300R, 300B and 300G can be insulated from the lower electrode 310R, 310B and 310G of adjacent light-emitting device 300R, 300B and 300G. A space between adjacent lower electrode 310R, 310B and 310G can be filled by a bank insulating layer 130. For example, the bank insulating layer 130 can cover an edge of each lower electrode 310R, 310B and 310G. The light-emitting layer 320 and the upper electrode 330 of each light-emitting device 300R, 300B and 300G can be stacked on a portion of the lower electrode 310R, 310B and 310G of the corresponding light-emitting device 300R, 300B and 300G exposed by the bank insulating layer 130.

Each of the light-emitting devices 300R, 300B and 300G can emit the light displaying the same color. For example, the light-emitting layer 320 of each light-emitting device 300R, 300B and 300G can generate the light displaying white color. The light-emitting layer 320 of each light-emitting device 300R, 300B and 300G can be coupled with the light-emitting layer 320 of adjacent light-emitting device 300R, 300B and 300G. For example, the light-emitting layer 320 of each light-emitting device 300R, 300B and 300G can extend onto the bank insulating layer 130. The upper electrode 330 of each light-emitting device 300R, 300B and 300G can extend along the light-emitting layer 320 of the corresponding light-emitting device 300R, 300B and 300G. For example, the upper electrode 330 of each light-emitting device 300R, 300B and 300G can be connected to the upper electrode 330 of adjacent light-emitting device 300R, 300B and 300G.

The light emitted from each light-emitting device 300R, 300B and 300G can pass through the corresponding color filter 400R, 400B and 400G. Each of the color filters 400R, 400B and 400G can realize the specific color of the corresponding pixel region RP, BP and GP by using the light emitted from the corresponding light-emitting device 300R, 300B and 300G. For example, the color filters 400R, 400B and 400G can include a red color filter 400R in the red pixel region RP, a blue color filter 400B in the blue pixel region BP and a green color filter 400G in the green pixel region GP.

Each of the color filter 400R, 400B and 400G can be disposed between the device substrate 100 and the corresponding light-emitting device 300R, 300B and 300G. For example, each of the color filters 400R, 400B and 400G can be disposed between the lower passivation layer 120 and the corresponding light-emitting device 300R, 300B and 300G. Each of the color filters 400R, 400B and 400G can be spaced away from adjacent color filter 400R, 400B and 400G. For example, the lower electrode 310R, 310B and 310G of each light-emitting device 300R, 300B and 300G can be connected to the drain electrode 260 of the corresponding thin film transistor 200 at the outside of the corresponding color filter 400R, 400B and 400G.

Each of the color filter 400R, 400B and 400G can overlap the portion of the corresponding lower electrode 310R, 310B and 310G exposed by the bank insulating layer 130. A horizontal distance of each color filter 400R, 400B and 400G can be larger than a horizontal distance of the portion of the corresponding lower electrode 310R, 310B and 310G exposed by the bank insulating layer 130. The lower electrode 310R, 310B and 310G of each light-emitting device 300R, 300B and 300G can be in contact with the corresponding color filter 400R, 400B and 400G. For example, an upper surface of each color filter 400R, 400B and 400G opposite to the device substrate 100 can be completely covered by the lower electrode 310R, 310B and 310G of the corresponding light-emitting device 300R, 300B and 300G. Thus, in the display apparatus according to the embodiment of the present invention, the light emitted from each light-emitting device 300R, 300B and 300G can pass through the corresponding color filter 400R, 400B and 400G, necessarily. Therefore, in the display apparatus according to the embodiment of the present invention, the light leakage caused by the light traveling toward adjacent pixel region RP, BP and GP without passing through the corresponding color filter 400R, 400B and 400G can be prevented.

The portion of each lower electrode 310R, 310B and 310G exposed by the bank insulating layer 130 may not overlap the thin film transistor 200 of the corresponding pixel region RP, BP and GP. For example, the thin film transistor 200 of each pixel region RP, BP and GP can overlap the bank insulating layer 130. Thus, in the display apparatus according to the embodiment of the present invention, the loss of the light due to the driving circuit of each pixel region RP, BP and GP can be prevented. The bank insulating layer 130 can extend between the color filters 400R, 400B and 400G. For example, a space between adjacent color filters 400R, 400B and 400G can be filled by the bank insulating layer 130.

Each of the lower electrodes 310R, 310B and 310G can extend to a side surface of the corresponding color filter 400R, 400B and 400G. For example, the red color filter 400R can be completely covered by a red lower electrode 310R of a red light-emitting device 300R which is disposed in the red pixel region RP of the device substrate 100, the blue color filter 400B can be completely covered by a blue lower electrode 310B of a blue light-emitting device 300B which is disposed in the blue pixel region BP of the device substrate 100, and the green color filter 400G can be completely covered by a green lower electrode 310G of a green light-emitting device 300G which is disposed in the green pixel region GP. Thus, in the display apparatus according to the embodiment of the present invention, a damage to the color filters 400R, 400B and 400G due to the external moisture can be prevented.

Each of the color filter 400R, 400B and 400G can include a dye. For example, the red color filter 400R can be formed of only a red dye, the blue color filter 400B can be formed of only a blue dye, and the green color filter 400G can be formed of only a green dye. The dye can have a relatively small particle size compared to pigment. The pigment cannot be dissolved in the solvent due to the particle size. However, the dye can have a relatively small particle size, so that the dye can be dissolved in the solvent. That is, in the display apparatus according to the embodiment of the present invention, the forming process of each color filter 400R, 400B and 400G can include a step of forming a dye layer by depositing the solvent in which the corresponding dye is dissolved, and a step of evaporating the solvent in the dye layer. Thus, in the display apparatus according to the embodiment of the present invention, the foreign matter may not occur in the forming process of the color filters 400R, 400B and 400G, and the loss of particles dispersed in the solvent can be prevented. Therefore, in the display apparatus according to the embodiment of the present invention, a surface of each color filter 400R, 400B and 400G may not include a recessed region due to the foreign matter or peeling off particles, as shown in FIG. 2.

The recessed region formed in the color filters 400R, 400B and 400G may cause a deformation of the layer stacked on the corresponding color filter 400R, 400B and 400G. For example, when the color filter 400R, 400B and 400G including the recessed region is in contact with the corresponding light-emitting device 300R, 300B and 300G, the lower electrode 310R, 310B and 310G, the light-emitting layer 320 and the upper electrode 330 of the corresponding light-emitting device 300R, 300B and 300G may include a bending region due to the recessed region of the color filter 400R, 400B and 400G. Since the light-emitting layer 320 of the light-emitting device 300R, 300B and 300G has the relatively low step coverage, the upper electrode 330 may be in contact with the corresponding lower electrode 310R, 310B and 310G in the bending region caused by the recessed region. That is, in the display apparatus according to the embodiment of the present invention in which the surface of each color filter 400R, 400B and 400G does not include the recessed region due to the foreign matter, the lower electrode 310R, 310B and 310G of each light-emitting device 300R, 300B and 300G being in contact with the corresponding color filter 400R, 400B and 400G may be not shorted with the upper electrode 330 of the corresponding light-emitting device 300R, 300B and 300G. Therefore, in the display apparatus according to the embodiment of the present invention, a step of forming an insulating layer like an over-coat layer, which covers the color filters 400R, 400B and 400G, and removes the thickness difference due to the color filters 400R, 400B and 400G, may be omitted.

An upper passivation layer 140 can be disposed on the light-emitting devices 300R, 300B and 300G. The upper passivation layer 140 can prevent the damage of the light-emitting devices 300R, 300B and 300G due to the external moisture and impact. The upper passivation layer 140 can extend along the upper electrode 330.

The upper passivation layer 140 can include an insulating material. For example, the upper passivation layer 140 can include silicon oxide and/or silicon nitride. The upper passivation layer 140 can have a multi-layer structure. For example, the upper passivation layer 140 can have a structure in which an organic layer formed of an organic insulating material can be disposed between inorganic layers formed of an inorganic insulating material.

An encapsulating layer 500 can be disposed on the upper passivation layer 140. The encapsulating layer 500 can prevent the damage of the light-emitting devices 300R, 300B and 300G due to the external moisture and impact. The encapsulating layer 500 can have a multi-layer structure. For example, the encapsulating layer 500 can have a stacked structure of a lower encapsulating layer 510 and an upper encapsulating layer 520. The lower encapsulating layer 510 can be disposed between the upper passivation layer 140 and the upper encapsulating layer 520.

The encapsulating layer 500 can include encapsulation moisture-absorbing particles 500p to absorb the permeated moisture. For example, the encapsulation moisture-absorbing particles 500p can be dispersed in the upper encapsulating layer 520. Thus, in the display apparatus according to the embodiment of the present invention, the stress applied to the light-emitting device 300R, 300B and 300G due to the expansion of the encapsulation moisture-absorbing particles 500p can be relieved by the lower encapsulating layer 510.

The encapsulating layer 500 can include an insulating material. The encapsulating layer 500 can include a material that does not require a curing process. For example, the encapsulating layer 500 can include an olefin-based material. Thus, in the display apparatus according to the embodiment of the present invention, the deterioration of the light-emitting devices 300R, 300B and 300G due to a forming process of the encapsulating layer 500 can be prevented. The lower encapsulating layer 510 can include a material different from the upper encapsulating layer 520.

An encapsulation substrate 600 can be disposed on the encapsulating layer 500. The encapsulation substrate 600 can include a material different from the device substrate 100. The encapsulation substrate 600 can radiate heat generated by the operation of the light-emitting devices 300R, 300B and 300G, and/or by the operation of the driving circuit. The encapsulation substrate 600 can have a thermal conductivity higher than the device substrate 100. For example, the encapsulation substrate 600 can include a metal, such as aluminum (Al).

The bezel area BA of the device substrate 100 can be disposed outside the display area AA of the device substrate 100. For example, the bezel area BA can include a side surface 100s of the device substrate 100. A circuit portion and lines which provide various signals to the display area AA can be disposed in the bezel area BA.

The encapsulating layer 500 and the encapsulation substrate 600 can extend on the bezel area BA of the device substrate 100. The encapsulating layer 500 can have a size smaller than the device substrate 100. For example, the side surface 100s of the device substrate 100 can be disposed outside a side surface 500s of the encapsulating layer 500. A size of the encapsulation substrate 600 can be larger than the size of the encapsulating layer 500. The encapsulation substrate 600 can have a size smaller than the device substrate 100. For example, a side surface 600s of the encapsulation substrate 600 can be disposed between the side surface 500s of the encapsulating layer 500 and the side surface 100s of the device substrate 100.

A light-blocking element 700 can be disposed on the bezel area BA of the device substrate 100. The light-blocking element 700 can block the light travelling through bezel area BA. The light-blocking element 700 can have a side surface 701s at the outside of the encapsulating layer 500. For example, a surface of the device substrate 100 disposed outside the encapsulating layer 500 can be covered by the light-blocking element 700.

The light-blocking element 700 can have a stacked structure of a first blocking filter layer 710 and a second blocking filter layer 720. For example, the first blocking filter layer 710 can be disposed between the device substrate 100 and the second blocking filter layer 720.

The first blocking filter layer 710 can include a dye same as one of the color filters 400R, 400B and 400G. For example, the first blocking filter layer 710 can include a material same as the red color filter 400R. The first blocking filter layer 710 can be formed by the forming process of the color filters 400R, 400B and 400G. For example, the first blocking filter layer 710 can be simultaneously formed with the red color filter 400R. The first blocking filter layer 710 can have a thickness same as the red color filter 400R.

The second blocking filter layer 720 can absorb the light passing through the first blocking filter layer 710. The second blocking filter layer 720 can include a dye different from the first blocking filter layer 710. For example, the second blocking filter layer 720 can include a material same as the blue color filter 400B. The second blocking filter layer 720 can be formed by the forming process of the color filters 400R, 400B and 400G. For example, the second blocking filter layer 720 can be simultaneously formed with the blue color filter 400B. The second blocking filter layer 720 can have the same thickness as the blue color filter 400B.

The light-blocking element 700 can include a region being in contact with the encapsulating layer 500. Thus, in the display apparatus according to the embodiment of the present invention, the external moisture permeating through the light-blocking element 700 can be collected by the encapsulating layer 500. Therefore, in the display apparatus according to the embodiment of the present invention, the permeation of the external moisture through the light-blocking element 700 having a stacked structure of blocking layers 710 and 720 which are formed of a material same as the color filters 400R, 400B and 400G, can be prevented.

Accordingly, the display apparatus according to the embodiment of the present invention can include color filters 400R, 400B and 400G composed of dyes, and a light-blocking element 700 having a stacked structure of blocking filter layers 710 and 720, which include different dyes. Thus, in the display apparatus according to the embodiment of the present invention, the forming process of the light-blocking element 700 can be simplified, and the forming process of an insulating layer covering the color filters 400R, 400B and 400G like the over-coat layer can be omitted. Therefore, in the display apparatus according to the embodiment of the present invention, the reflection of the external light in the bezel area can be prevented, and the process efficiency can be improved.

Figure 3:
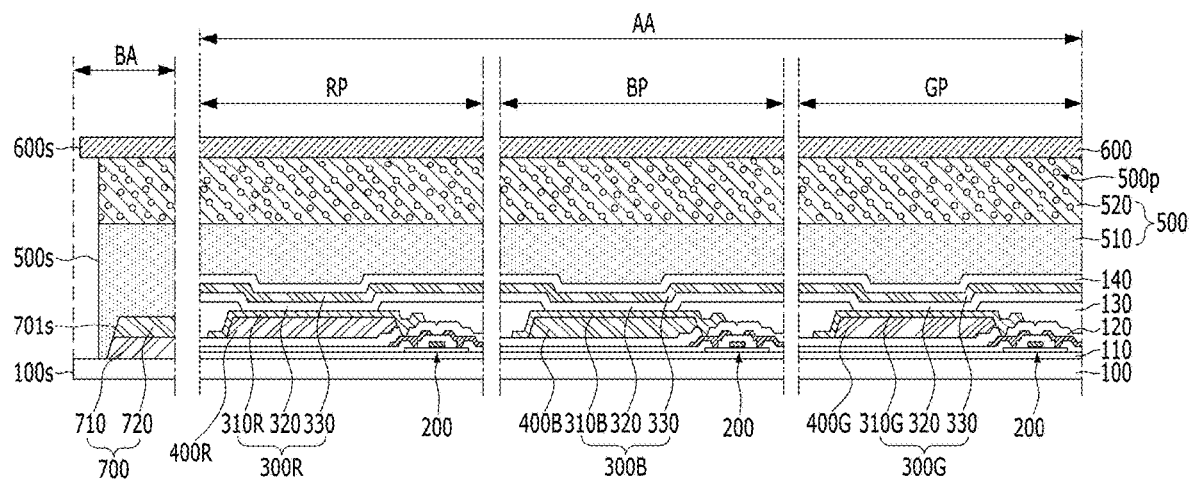
FIGS. 3 to 8 are views respectively showing various examples of a display apparatus according to another embodiment of the present invention.

The display apparatus according to the embodiment of the present invention is described that a first side 701s of the light-blocking element 700 toward the side surface 100s of the device substrate 100 is disposed outside the encapsulating layer 500. However, in the display apparatus according to another embodiment of the present invention, the side surface 500s of the encapsulating layer 500 can be disposed between the side surface 100s of the device substrate 100 and the light-blocking element 700, as shown in FIG. 3. Thus, in the display apparatus according to another embodiment of the present invention, the first side 701s of the light-blocking element 700 toward the side surface 100s of the device substrate 100 can be covered by the encapsulating layer 500. Therefore, in the display apparatus according to another embodiment of the present invention, the permeation of the external moisture through the light-blocking element 700 can be efficiently prevented.

Figure 4:
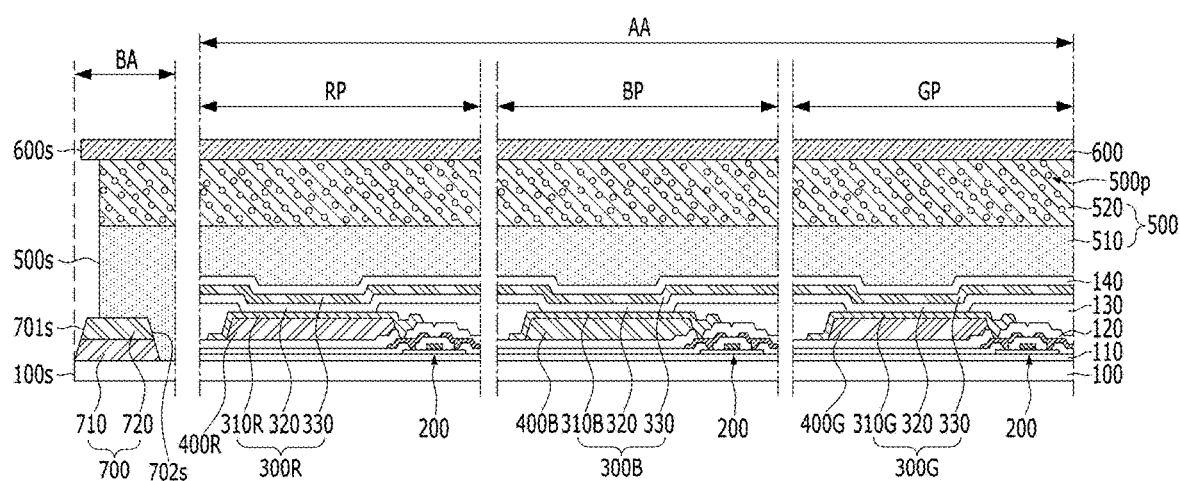

The display apparatus according to the embodiment of the present invention is described that the light-blocking element 700 extends in a direction toward the display area AA. However, in the display apparatus according to another embodiment of the present invention, the first side 701s of the light-blocking element 700 toward the side surface 100s of the device substrate 100, and a second side 702s of the light-blocking element 700 opposite to the first side 701s can be disposed in the bezel area BA of the device substrate 100, as shown in FIG. 4. That is, in the display apparatus according to another embodiment of the present invention, the light-blocking element 700 can be spaced away from component elements which are disposed in the display area AA of the device substrate 100, such as the bank insulating layer 130. Therefore, in the display apparatus according to another embodiment of the present invention, the damage of the light-emitting devices 300R, 300B and 300G due to the permeation of the external moisture through the light-blocking element 700 can be efficiently prevented.

Figure 5:
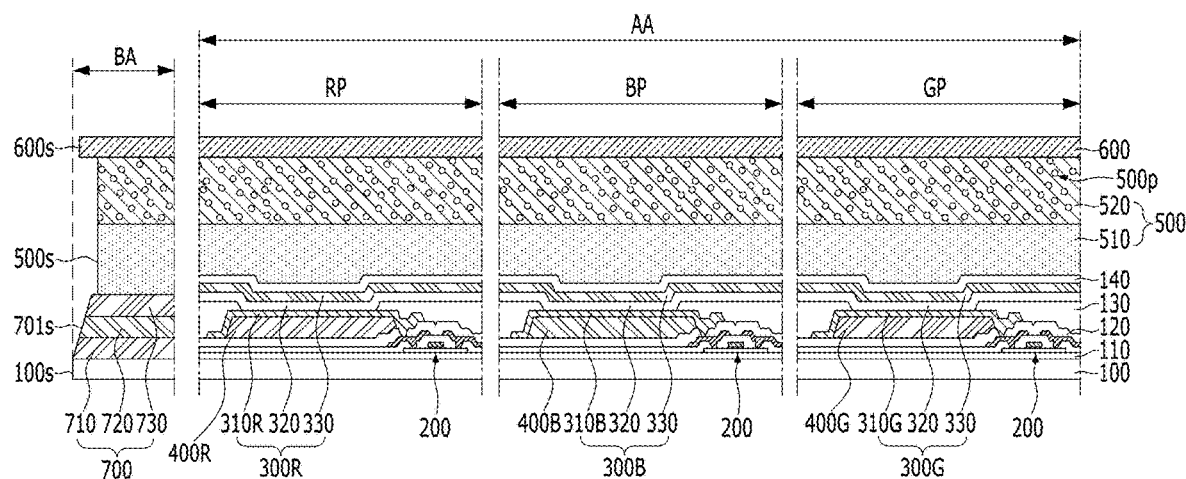

The display apparatus according to the embodiment of the present invention is described that the first blocking filter layer 710 of the light-blocking element 700 includes the red dye, the second blocking filter layer 720 of the light-blocking element 700 includes the blue dye. However, in the display apparatus according to another embodiment of the present invention, the light-blocking element 700 can have a stacked structure of the first blocking filter layer 710 including the blue dye same as the blue color filter 400B, and the second blocking filter layer 720 including the green dye same as the green color filter 400G. Alternately, the display apparatus according to another embodiment of the present invention can include the light-blocking element 700 having a stacked structure of the first blocking filter layer 710 including the red dye same as the red color filter 400R, the second blocking filter layer 720 including the blue dye same as the blue color filter 400B, and a third blocking filter layer 730 including the green dye same as the green color filter 400G, as shown in FIG. 5. A thickness of the third blocking filter layer 730 can be the same as a thickness of the green color filter 400G. That is, in the display apparatus according to another embodiment of the present invention, the light-blocking element 700 having various structure can be used. Thus, in the display apparatus according to another embodiment of the present invention, the reflection of the external light in the bezel area BA can be efficiently prevented by the light-blocking element 700 without decreasing the process efficiency.

Figure 6:
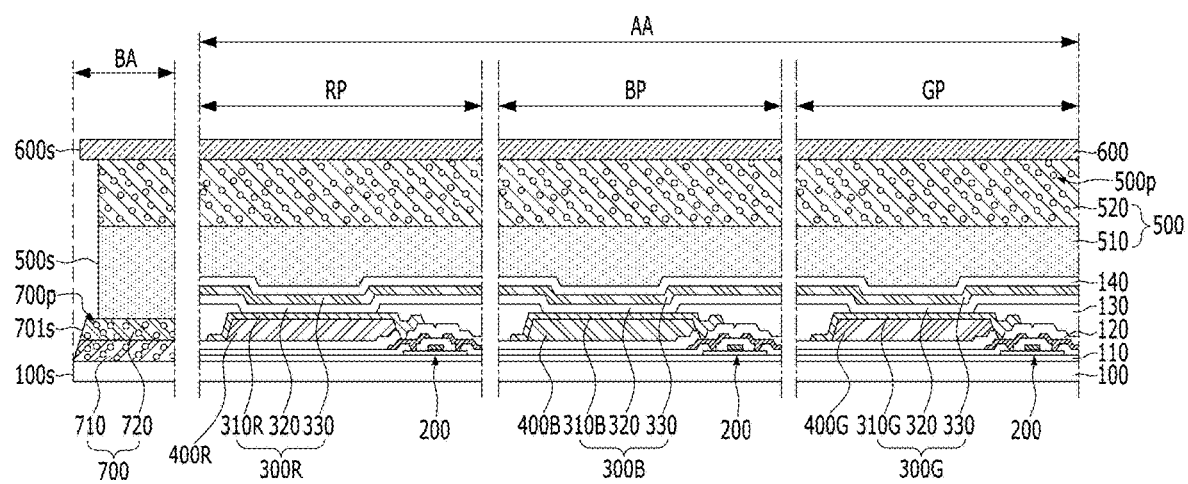

The display apparatus according to the embodiment of the present invention is described that the external moisture permeated through the light-blocking element 700 is collected by the encapsulating layer 500. However, the display apparatus according to another embodiment of the present invention can further include blocking moisture-absorbing particles 700p dispersed in the light-blocking element 700 to absorbing the moisture, as shown in FIG. 6. For example, the process of forming the display apparatus according to another embodiment of the present invention can include a step of forming a dye layer by depositing a solvent in which the dye is dissolved on the device substrate 100 in which the lower passivation layer 120 is formed, a step of doping the blocking moisture-absorbing particles 700p in a portion of the dye layer which is disposed on the bezel area BA of the device substrate 100, a step of forming a filter layer by removing the solvent in the dye layer, and a step of simultaneously forming the color filters 400R, 400B and 400G, and the blocking filter layer 710 and 720 by patterning the filter layer. Thus, in the display apparatus according to another embodiment of the present invention, the damage of the driving circuit and the light-emitting devices 300R, 300B and 300G due to the permeation of the external moisture can be efficiently prevented.

Figure 7:
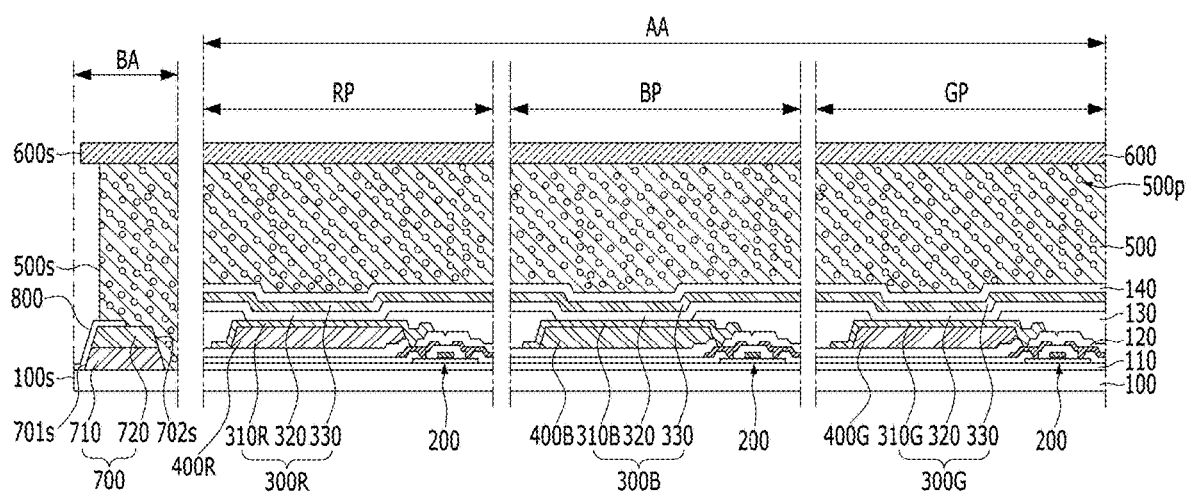

The display apparatus according to the embodiment of the present invention is described that the first side 701s of the light-blocking element 700 toward the side surface 100s of the device substrate 100 is exposed to the outside. However, the display apparatus according to another embodiment of the present invention can include a blocking passivation layer 800 covering a portion of the light-blocking element 700 which is disposed outside the encapsulating layer 500, as shown in FIG. 7. The first side 701s of the light-blocking element 700 toward the side surface 100s of the device substrate 100 can be covered by the blocking passivation layer 800. The hardness of the blocking passivation layer 800 can be larger than the hardness of the light-blocking element 700. Thus, in the display apparatus according to another embodiment of the present invention, the portion of the light-blocking element 700 disposed outside the encapsulating layer 500 can be not damaged by the encapsulation substrate 600 or the external impact.

The blocking passivation layer 800 can be formed by the process of forming the light-emitting devices 300R, 300B and 300G. The blocking passivation layer 800 can include a material same as the lower electrodes 310R, 310B and 310G. For example, the blocking passivation layer 800 can include a transparent conductive material, such as ITO and IZO. Thus, in the display apparatus according to another embodiment of the present invention, the additional process for forming the blocking passivation layer 800 can be not required. Therefore, in the display apparatus according to another embodiment of the present invention, the damage of the light-blocking element 700 preventing the reflection of the external light in the bezel area BA can be prevented without decreasing the process efficiency.

An end portion of the blocking passivation layer 800 can be disposed between a surface of the light-blocking element 700 toward the encapsulation substrate 600 and the encapsulating layer 500. The second side 702s of the light-blocking element 700 opposite to the first side 701s can be disposed in the bezel area BA of the device substrate 100. Thus, in the display apparatus according to another embodiment of the present invention, the second side 702s of the light-blocking element 700 can be covered by the encapsulating layer 500. For example, in the display apparatus according to another embodiment of the present invention, the second side 702s of the light-blocking element 700 can be in contact with the encapsulating layer 500. The encapsulating layer 500 can be a single layer including the blocking moisture-absorbing particles 500p. Therefore, in the display apparatus according to another embodiment of the present invention, the damage of the light-blocking element 700 due to the external impact or the encapsulation substrate 600, and the permeation of the external moisture through the light-blocking element 700 can be efficiently prevented.

Figure 8:
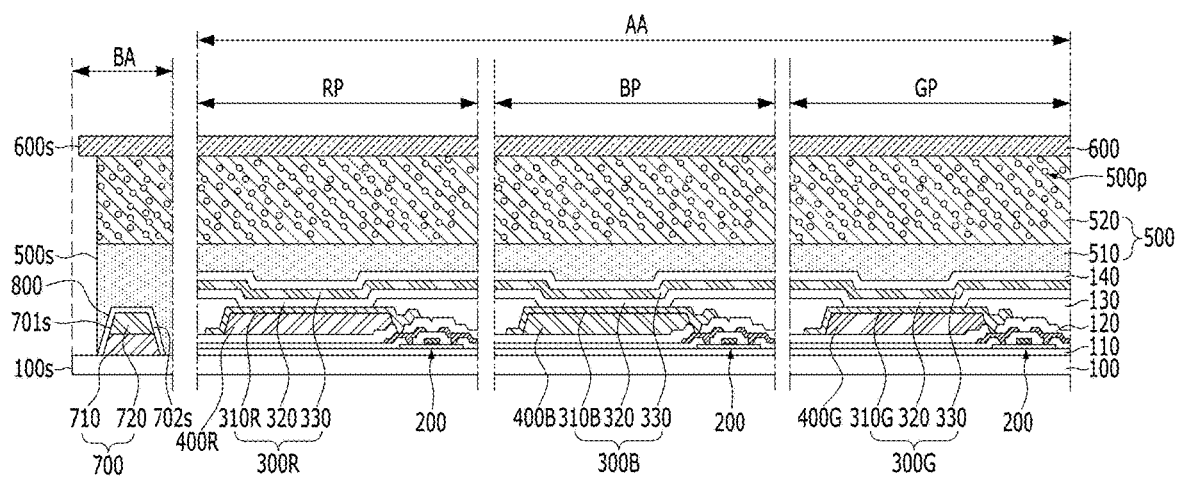

The display apparatus according to another embodiment of the present invention can include the blocking passivation layer completely covering the light-blocking element 700, as shown in FIG. 8. The blocking passivation layer 800 can have a water vapor transmission rate (WVTR) lower than the light-blocking element 700. For example, the light-blocking element 700 can include the first side 701s and the second side 702s, which are disposed in the bezel area BA of the device substrate 100, and the side surface 500s of the encapsulating layer 500 can be disposed closer to the side surface 100s of the device substrate 100 than the light-blocking element 700. Thus, the display apparatus according to another embodiment of the present invention can efficiently prevent the light-blocking element 700 from functioning as a path of permeating the external moisture.

As a result, the display apparatus according to the embodiments of the present invention can include the color filters including dye(s), and the light-emitting devices including the lower electrode which are stacked on the display area of the device substrate. The lower electrode of each light-emitting device can be in contact with the corresponding color filter. The light-blocking element having a stacked structure of blocking layers including different dyes can be disposed on the bezel area of the device substrate. Thus, in the display apparatus according to the embodiments of the present invention, the process of forming the light-blocking element to prevent the reflection of the external light in the bezel area can be simplified. Therefore, in the display apparatus according to the embodiments of the present invention, the quality of the image realized by the display area can be effectively improved.

What is claimed is:

1. A display apparatus comprising:
a device substrate including a display area and a bezel area disposed outside the display area;
a plurality of color filters on the display area of the device substrate, each of the color filters including a dye;
a plurality of light-emitting devices on the color filters, each of the light-emitting devices including a lower electrode being in contact with a corresponding color filter among the color fillers;
a light-blocking element on the bezel area of the device substrate, the light-blocking element including a stacked structure of blocking filter layers including different dyes;
an encapsulating layer on the light-emitting devices, the encapsulating layer extending onto the bezel area of the device substrate; and
an encapsulation substrate on the encapsulating layer,
wherein a side surface of the encapsulating layer is disposed between a side surface of the device substrate and the light-blocking element.

2. The display apparatus according to claim 1, wherein the stacked structure of the light-blocking element is a stacked structure of a first blocking filter layer including a red dye and a second blocking filter layer including a blue dye.

3. The display apparatus according to claim 2, wherein the light-blocking element further includes a third blocking filter layer including a green dye.

4. The display apparatus according to claim 1, further comprising blocking moisture-absorbing particles dispersed in each blocking filter layer of the light-blocking element.

5. The display apparatus according to claim 1, further comprising a blocking passivation layer between the light-blocking element and the encapsulating layer,
wherein a water vapor transmission rate of the blocking passivation layer is lower than a water vapor transmission rate of the light-blocking element.

6. A display apparatus comprising:
a first color filter on a first pixel region of a device substrate, the first color filter including a first dye;
a first light-emitting device on the first color filter, the first light-emitting device including a first lower electrode being in contact with the first color filter;
a second color filter on a second pixel region of the device substrate, the second color filter including a second dye different from the first dye;
a second light-emitting device on the second color filter, the second light-emitting device including a second lower electrode being in contact with the second color filter;
a light-blocking element on a bezel area of the device substrate, the light-blocking element including a stacked structure of a first blocking filter layer including the first dye and a second blocking filter layer including the second dye;
an encapsulating layer covering the first light-emitting device and the second light-emitting device, the encapsulating layer extending onto the bezel area of the device substrate; and
an encapsulation substrate on the encapsulating layer,
wherein the bezel area is disposed outside a display area including the first pixel region and the second pixel region, and
wherein a first side of the light-blocking element toward a side surface of the device substrate is disposed outside the encapsulating layer.

7. The display apparatus according to claim 6, wherein a thickness of the first blocking filter layer is the same as a thickness of the first color filter, and
wherein a thickness of the second blocking filter layer is the same as a thickness of the second color filter.

8. The display apparatus according to claim 6, wherein the encapsulating layer includes an encapsulation moisture-absorbing material.

9. The display apparatus according to claim 6, further comprising a blocking passivation layer on the first side of the light-blocking element, the blocking passivation layer extending between the light-blocking element and the encapsulating layer.

10. The display apparatus according to claim 9, wherein the blocking passivation layer has a hardness greater than a hardness of the light-blocking element.

11. The display apparatus according to claim 9, wherein a second side of the light-blocking element opposite the first side of the light-blocking element is disposed on the bezel area of the device substrate.

12. The display apparatus according to claim 11, wherein the second side of the light-blocking element is disposed outside the blocking passivation layer, and
wherein the encapsulating layer is in contact with the second side of the light-blocking element.

13. The display apparatus according to claim 11, wherein the blocking passivation layer is further on the second side of the light-blocking element, and
wherein the blocking passivation layer completely covers the light-blocking element.

14. The display apparatus according to claim 6, wherein the second color filter is spaced away from the first color filter, and
wherein a space between the first color filter and the second color filter is filled by a bank insulating layer covering an edge of the first lower electrode and an edge of the second lower electrode.

15. A display apparatus comprising:
a device substrate including a display area and a bezel area disposed outside the display area;
a plurality of color filters on the display area, the color filters including different dyes;
a plurality of light-emitting devices on the color filters;
a light-blocking element on the bezel area, the light-blocking element including a stacked structure of a plurality of blocking filter layers including different dyes;
an encapsulating layer on the light-emitting devices, the encapsulating layer extending onto the bezel area of the device substrate; and
an encapsulation substrate on the encapsulating layer,
wherein each of the blocking filter layers includes the same dye as one of the color filters, and
wherein a side surface of the encapsulating layer is disposed between a side surface of the device substrate and the light-blocking element.

* * * * *